(12) United States Patent
Mazumder

(10) Patent No.: US 10,312,919 B2
(45) Date of Patent: *Jun. 4, 2019

(54) APPARATUSES WITH AN EMBEDDED COMBINATION LOGIC CIRCUIT FOR HIGH SPEED OPERATIONS

(71) Applicant: Micron Technology, Inc., Boise, ID (US)

(72) Inventor: Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/105,836

(22) Filed: Aug. 20, 2018

(65) Prior Publication Data

US 2018/0358971 A1 Dec. 13, 2018

Related U.S. Application Data

(63) Continuation of application No. 15/684,734, filed on Aug. 23, 2017, now Pat. No. 10,063,240, which is a continuation of application No. 15/184,077, filed on Jun. 16, 2016, now Pat. No. 9,762,247.

(51) Int. Cl.
| | |
|---|---|
| *H03K 19/21* | (2006.01) |
| *H03K 21/40* | (2006.01) |
| *G11C 8/06* | (2006.01) |
| *G11C 7/10* | (2006.01) |
| *G06F 5/06* | (2006.01) |
| *H03K 21/10* | (2006.01) |

(52) U.S. Cl.
CPC ............ *H03K 21/40* (2013.01); *G06F 5/06* (2013.01); *G11C 7/109* (2013.01); *G11C 7/1087* (2013.01); *G11C 8/06* (2013.01); *H03K 19/21* (2013.01); *H03K 21/10* (2013.01)

(58) Field of Classification Search
CPC .......... H03K 19/21; H03K 21/40; G06F 5/06; G06F 5/065
See application file for complete search history.

(56) References Cited

U.S. PATENT DOCUMENTS

| | | | | | |
|---|---|---|---|---|---|
| 4,549,263 | A | * | 10/1985 | Calder | G06F 13/124 710/21 |
| 4,785,415 | A | * | 11/1988 | Karlquist | G06F 5/065 710/52 |
| 4,839,866 | A | * | 6/1989 | Ward | G06F 5/10 365/189.08 |

(Continued)

*Primary Examiner* — Jason Crawford
(74) *Attorney, Agent, or Firm* — Dorsey & Whitney LLP

(57) ABSTRACT

Apparatuses for performing combination logic operations with an combination logic circuit are disclosed. According to one embodiment, the apparatus comprises a first-in-first-out stage comprising an combination logic circuit, a input ring counter circuit coupled to the first-in-first-out stage and configured to selectively provide a push signal to the first-in-first-out stage, and a output ring counter circuit coupled to the first-in-first-out stage and configured to selectively provide a pop signal to the first-in-first-out stage, wherein the first-in-first-out stage is configured to perform calculations on input data with the combination logic circuit to generate output data responsive to receiving the push signal and to provide the output data based on the calculations responsive to receiving the pop signal.

20 Claims, 6 Drawing Sheets

(56) References Cited

U.S. PATENT DOCUMENTS

| | | | | |
|---|---|---|---|---|
| 5,406,554 | A * | 4/1995 | Parry | G06F 5/06 |
| | | | | 365/189.02 |
| 5,684,997 | A * | 11/1997 | Kau | G06F 13/24 |
| | | | | 710/260 |
| 6,348,828 | B1 * | 2/2002 | Barnes | H03K 5/1252 |
| | | | | 327/276 |
| 9,762,247 | B1 * | 9/2017 | Mazumder | H03K 21/40 |
| 10,063,240 | B2 * | 8/2018 | Mazumder | H03K 21/40 |
| 2009/0010092 | A1 * | 1/2009 | Fujisawa | G11C 7/1018 |
| | | | | 365/236 |
| 2017/0041006 | A1 * | 2/2017 | Uezato | H03K 21/38 |
| 2017/0366188 | A1 | 12/2017 | Mazumder | |

\* cited by examiner

APPARATUSES WITH AN EMBEDDED COMBINATION LOGIC CIRCUIT FOR HIGH SPEED OPERATIONS

CROSS-REFERENCE TO RELATED APPLICATION(S)

This application is a continuation of U.S. patent application Ser. No. 15/684,734, filed on Aug. 23, 2017, and issued as U.S. Pat. No. 10,063,240, which is a continuation of U.S. patent application Ser. No. 15/184,077, filed on Jun. 16, 2016, and issued as U.S. Pat. No. 9,762,247 on Sep. 12, 2017. The aforementioned applications and patents are incorporated herein by reference, in their entirety, and for any purposes.

BACKGROUND

Many memory devices include combination logic to perform discrete operations and/or calculations within the memory device itself. In traditional memory devices, the combination logic may be broken down into stages. The stages may be implemented within a chain of flip-flops (e.g., D flip-flops). Each flip-flop is commonly clocked, so the combination logic between each flip-flop in the chain must complete before the next clock cycle. That is, a first flip-flop detects a clock edge and provides a data output to the combination logic. The combination logic performs the calculation and provides its output to the data input of the next flip-flop in the chain before the next clock edge. One drawback to the chained flip-flop architecture is that time is wasted for every flip-flop stage because each flip-flop has an associated setup time and a time period between the detection of the clock signal edge and delivery of the data input to the output terminal. This time is characteristic of the flip-flops and therefore unavoidable in traditional chained flip-flop architectures.

One example of combination logic is a command parity error calculation, such as that performed in double data rate 4 (DDR4) memory devices. An example command parity calculation includes a five stage XOR tree that operates on parity data provided with a command to a memory device. The parity error calculation is performed within a defined parity latency period that specifies the number of clock cycles during which the parity error calculation must be completed. Therefore, the parity latency determines the number of flip-flops in the chain, as well as the number of logic stages that must be completed between each flip-flop. For example, if the parity latency is 5 clock cycles (e.g., the result of the calculation must be available at the fifth rising clock edge) and the XOR tree has five stages, then two stages must be completed during one clock period between adjacent flip-flops in the chain. Because there are only four clock periods to perform five stages worth of calculations, one of the clock periods must double up and two stages must be calculated during the clock period to ensure that the calculation is completed within the parity latency period. In general, if the latency is N cycles, then the calculation is performed in N−1 cycles so that the result is available for output on the $N^{th}$ cycle.

Alternatively, the parity latency may be greater than the number of stages. For example, if the parity latency is set to 8 clock cycles, then seven clock periods are available, but only five stages of calculation are needed. In this scenario, the parity calculation cannot take advantage of the additional clock periods available for calculation, and the result of the calculation is simply passed from flip-flop to flip-flop for the last two clock cycles.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments disclosed herein recognize that traditional flip-flop chains are limited in their ability to perform combination logic operations or calculations in stages. Specifically, in situations where the number of flip-flop stages is fewer than the number of combination logic stages, multiple combination logic stages often need to be performed during a single clock cycle. Alternatively, where the number of flip-flop stages is greater than the number of combination logic stages, there may be unused clock cycles during which the result of the combination logic calculation is simply transferred from one flip-flop stage to the next. Embodiments disclosed herein provide an apparatus including a FIFO stack circuit having an combination logic circuit for performing high speed combination logic operations without the inefficiencies of previous architectures in order to relax timing constraints on combination logic calculations over the entire available number of clock periods.

Figure 1:
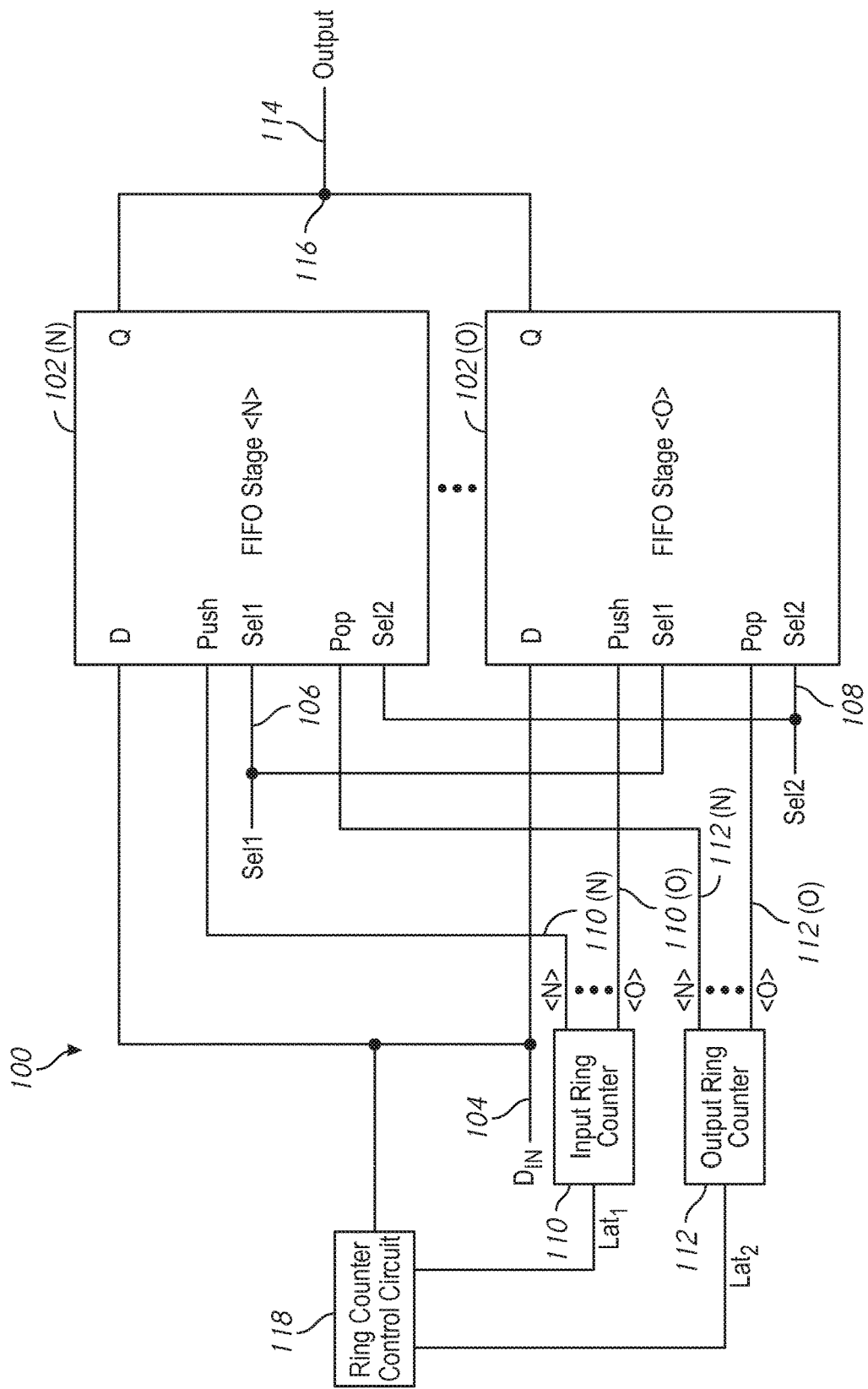
FIG. 1 is a block diagram of a first-in-first-out "FIFO") stack circuit, in accordance with an embodiment of the present invention.

FIG. 1 is a block diagram of a FIFO stack circuit, generally designated 100, in accordance with an embodiment of the present invention. The FIFO stack circuit 100 generally includes a number of FIFO stages 102(0)-102(N) (collectively referred to as FIFO stages 102, or generically as a FIFO stage 102), a input ring counter circuit 110, and a output ring counter circuit 112, and a ring counter control circuit 118. Each FIFO stage 102 is configured to receive data input via a common data input line 104, a common first select line 106, and a common second select line 108, first select line 106. Although the data input line 104, the first select line 106, and the second select line 108 are referred to herein as common, meaning that all of the FIFO stages 102 share the input, those skilled in the art will appreciate that in some embodiments, each FIFO stage 102 may have a respective data input line 104, first select line 106, and second select line 108.

The common data input line 104 may provide a multi-bit data input signal to all of the FIFO stages 102. For example, the data input signal may include 24 bit parity data associated with a memory command for a parity error calculation. Each FIFO stage 102 may be further configured to receive a respective push signal and a respective pop signal. For example, FIFO stage 102(0) may be configured to receive push signal 110(0) and the pop signal 112(0). Unlike the common data input line 104, common first select line 106, and common second select line 108, which are provided to all of the FIFO stages 102, each FIFO stage 102 may be configured to receive a respective push signal and a respective pop signal. Generally, each FIFO stage 102 may be configured to receive the data input signal on the common data input line 104 responsive to receiving a respective push signal, perform combination logic operations or calculations with a combination logic circuit, and provide the result of the combination logic calculations responsive to receiving the respective pop signal. The outputs of the FIFO stages 102 may be commonly coupled at a node 116 to provide an output signal 114. An example FIFO stage 102 is discussed in further detail below with respect to FIG. 2.

The input ring counter circuit 110 may generally be any ring counter circuit or equivalent circuit that is configured to receive an input latch signal $Lat_1$ and provide an individual push signal to each of the FIFO stages 102. For example, the input ring counter circuit 110 provides a push signal 110(0) to the FIFO stage <0> 102(0) responsive to a first input latch signal $Lat_1$ and a push signal 110(N) to the FIFO stage <N> 102(N) responsive to an $N^{th}$ input latch signal $Lat_1$. The input ring counter circuit 110 may be, for example, an Overbeck ring counter or a Johnson ring counter. The input ring counter circuit 110 may be configured such that only one of the push signals 110(0)-(N) is active (e.g., logical high) at any given time. For example, when push signal 110(0) is active, push signals 110(1)-(N) are inactive. By only having one push signal active at any given time, a common data input line 104 may be used for all of the FIFO stages 102 without concern that the input data will be provided to multiple FIFO stages 102. An example input ring counter circuit 110 is discussed in further detail below with respect to FIG. 3.

The output ring counter circuit 112 may generally be any ring counter circuit or equivalent circuit that is configured to receive an output latch signal $Lat_2$ and provide an individual pop signal to each of the FIFO stages 102. For example the output ring counter circuit 112 provides a pop signal 112(0) to the FIFO stage <0> 102(0) responsive to a first output latch signal $Lat_2$ and a pop signal 112(N) to the FIFO stage <N> 102(N) responsive to an $N^{th}$ output latch signal $Lat_2$. The pop ring 112 may be configured to operate in substantially the same manner as the push ring (e.g., an Overbeck ring counter or a Johnson ring counter), with the exception that each pop signal may be temporally offset from an associated push signal by a predetermined time period. For example, the output ring counter circuit 112 may be configured to provide the pop signal 112(0) to the FIFO stage 102(0) after a predetermined time period elapses following the input ring counter circuit 110 providing the push signal 110(0) to the FIFO stage 102(0). That is, the predetermined time period may separate the input latch signal $Lat_1$ and the output latch signal $Lat_2$. In embodiments where the FIFO stages 102 are used with combination logic (e.g., to perform parity error calculations), the predetermined time period may be equal to a predetermined or configurable parity latency multiplied by the clock period of the memory. For example, if the parity latency is eight and the clock period is 625 ps, then the pop ring 112 may be configured to provide the pop signal 110(0) after 5000 ps (8×625 ps) elapse following the input ring counter circuit 110 providing the push signal 110(0).

The ring counter control circuit 118 may be coupled to the common data input line 104, the input ring counter circuit 110, and the output ring counter circuit 112. The ring counter control circuit 118 may be configured to detect each time input data are provided on the common data input line 104 and to provide an input latch signal $Lat_1$ and an output latch signal $Lat_2$ responsive to detecting the input data. For example, the ring counter control circuit 118 may be configured to detect input data on the common data input line 104 and provide the input latch signal $Lat_1$ to the input ring counter circuit 110 in order to trigger a push signal to one of the FIFO stages 102. After a predetermined time period, the ring counter control circuit 118 may provide the output latch signal $Lat_2$ to the output ring counter circuit 112 in order to trigger a pop signal to the FIFO stage 102 that received the push signal.

In operation, input data may be provided to all of the FIFO stages 102 on the common data input line 104. The common first select signal Sel1 may be enabled. The ring counter control circuit 118 may be configured to provide the input latch signal $Lat_1$ to the input ring counter circuit 110 responsive to input data provided via the common data input line. The input ring counter circuit 110 may provide a respective push signal to one of the FIFO stages 102 (e.g., push signal 110(0) may be provided to the FIFO stage <0> 102(0)). The selected FIFO stage 102 may receive the data input and perform combination logic operations on the data with a combination logic circuit. After a predetermined time period passes, the second select signal 106 may be enabled and the ring counter control circuit 118 may provide the output latch signal $Lat_2$ to the output ring counter circuit 112. The output ring counter circuit 112 may provide a respective pop signal to the selected FIFO stage (e.g., pop signal 112(0) may be provided to the FIFO stage <0> 102(0)), and the result of the combination logic calculations is provided to the common node 116. In various embodiments, the predetermined time is configurable based on the amount of time between when the input data are received by the FIFO stage and when the output data are needed. For example, in the embodiment where the combination logic is configured to perform a parity error calculation, the time between the push signal and the pop signal may be equal to the parity latency multiplied by the clock period. The timing of the push and pop signals is discussed in further detail below with respect to FIG. 4.

Although the common first select line 106 and the common second select line 108 are described as being activated at the time of the push and pop signals, respectively, those skilled in the art will appreciate that the common first select line 106 and the common second select line 108 may generally be activated at any time prior to the respective push signal and pop signal. In some embodiments, the common first select line 106 and the common second select line 108 may be maintained in an active state whenever the memory is capable of receiving a command.

Figure 2:
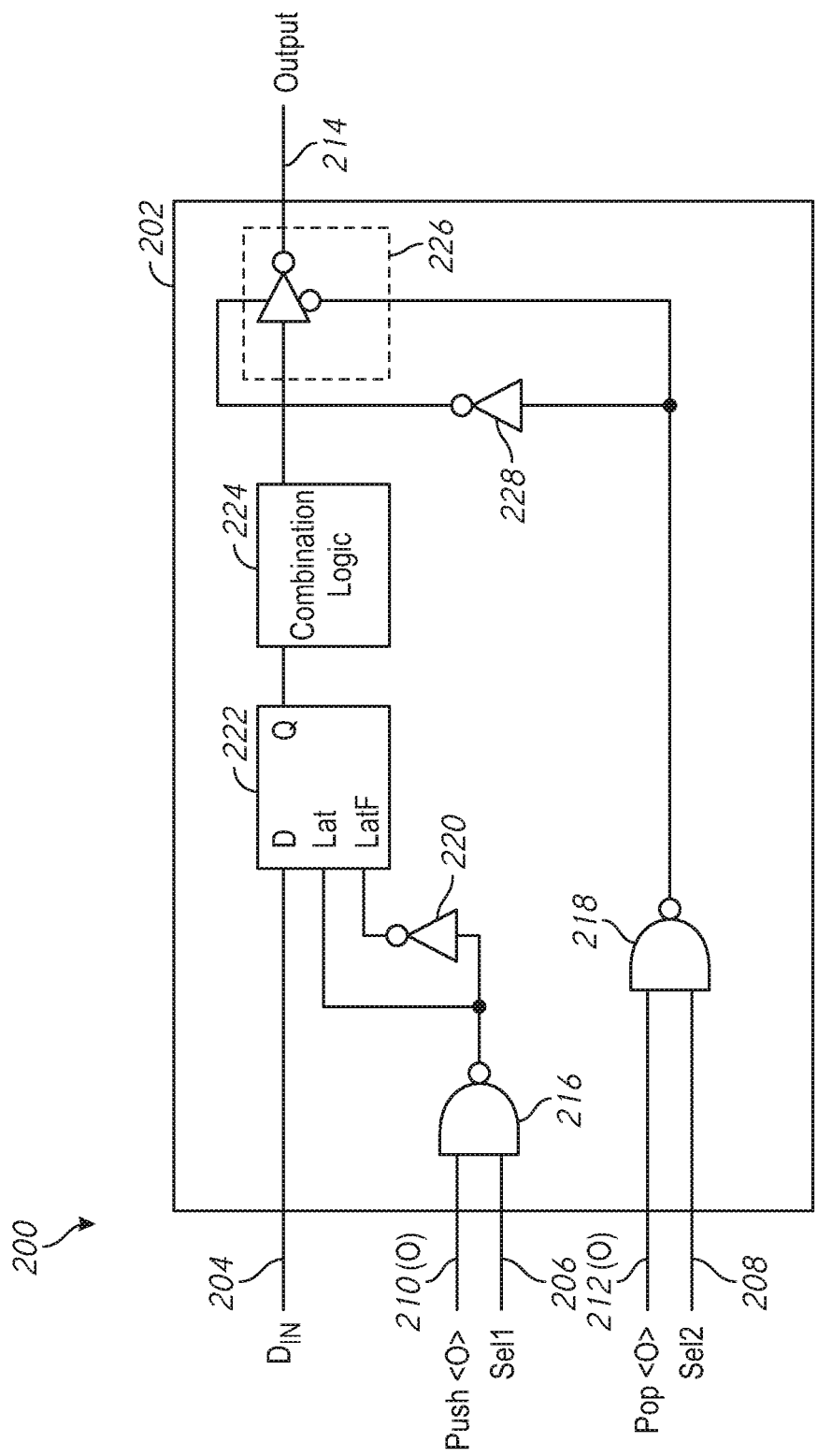
FIG. 2 is a block diagram of a FIFO stage with a combination logic circuit, in accordance with an embodiment of the present invention.

FIG. 2 is a block diagram of a FIFO stage 202 with combination logic circuit 224, in accordance with an embodiment of the present invention. The FIFO stage 202 may be implemented as one or more of the FIFO stages 102(0)-102(N) of FIG. 1, for example, as FIFO stage <0>

102(0) in FIG. 1. The FIFO stage 202 includes a first NAND gate 216, a second NAND gate 218, a first inverter 220, a latch 222, combination logic circuit 224, an output circuit 226, and a second inverter 228. In some embodiments, the output circuit 226 may include an inverter circuit having a high impedance input terminal and an inverting high impedance input terminal, for example, as shown in FIG. 2. Such an inverter circuit is configured to provide the output signal 214, or have a high impedance output responsive to signals provided to the high impedance and inverting high impedance input terminals. In other embodiments, the output circuit 226 may include additional or alternative circuits configured to provide an output signal. The latch 222 may generally be any type of flip-flop or latch that can receive input data and provide output data responsive to a signal. The combination logic circuit 224 may generally include any combination logic, other circuitry configured to perform calculations (e.g., arithmetic operations, scaling operations, etc.), or other circuitry that receives input data and provides output data. In one embodiment, the combination logic circuit 224 includes combination logic for performing a command parity error calculation. In another embodiment, the combination logic circuit 224 includes combination logic for performing a bank decode operation for a read/write auto-pre-charge operation. The FIFO stage 202 may generally be configured to receive data input on data input line 204, a first select signal 206, a second select signal 208, a push signal 210(0), and a pop signal 212(0). The FIFO stage 202 may be configured to provide an output signal 214.

The push signal 210(0) and the first select signal 206 may be coupled to the input terminals of the first NAND gate 216. The output terminal of the first NAND gate 216 may be coupled to the clock terminal Lat of the latch 222 and to the input terminal of the first inverter 220. The output terminal of the first inverter 220 may be coupled to the inverting clock terminal LatF of the latch 222. The data input line 204 may be coupled to the data input terminal D of the latch 222. The output terminal Q of the latch 222 may be coupled to the combination logic circuit 224. In general, the combination logic circuit 224 may be any circuit configured to perform combination logic operations on a data signal and to provide an output signal. An example of a combination logic circuit 224 for performing a parity error calculation is discussed in further detail below with respect to FIG. 5. The output of the combination logic circuit 224 is coupled to an input terminal of the output circuit 226. The output terminal of the output circuit 226 provides the output signal 214. In various embodiments, the output terminal of the output circuit 226 may be coupled to a common node (not shown). One or more additional FIFO stages in a FIFO stack circuit may also be coupled to the common node to provide an output signal, for example, as described above with respect to FIG. 1. The pop signal 212(0) and the second select signal 208 may be coupled to the input terminals of the second NAND gate 218. The output terminal of the second NAND gate 218 may be coupled to an input terminal of the second inverter 228 and an inverting high impedance input terminal of the output circuit 226. The output terminal of the second inverter 228 may be coupled to an inverting high impedance input terminal of the output circuit 226.

In operation, input data are provided to the flip flop 222 of FIFO stage 202 via the data input line 204. The FIFO stage 202 may be one of many FIFO stages in a FIFO stack circuit. When the first select signal 206 and the push signal 210(0) are activated, the first NAND gate 216 provides a latch signal to the latch terminal Lat and an inverted latch signal by way of the first inverter 220 to the inverting clock terminal LatF of the latch 222. The input data are pushed into the FIFO stage 202 responsive to the latch and inverted latch signals. When the input data are pushed into the FIFO stage 202, the latch 222 provides the input data to the combination logic circuit 224 to perform combination logic operations on the input data, such as performing a parity error calculation. Once the combination logic circuit 224 completes the combination logic calculations, the result is provided to the input terminal of the output circuit 226. The output circuit 226 may be maintained in a high impedance state until a predetermined time has elapsed (e.g., the parity latency multiplied by the clock period of the memory). After the predetermined time, the second select signal 208 and the pop signal 212(0) may be activated and provided to the second NAND gate 218. The output of the second NAND gate 218 may be provided to the inverting high impedance input of the output circuit 226 and the second inverter 228. The second inverter 228 provides its output to the high impedance input of the output circuit 226. As a result of the active second select signal 208 and the pop signal 212(0), the output circuit 226 may be selectively enabled and exit the high impedance state to provide the output of the combination logic circuit 224 as the output signal 214.

The predetermined time between the push signal 210(0) and the pop signal 212(0) may be configurable. For example, the predetermined time may be configured to be equal to the parity latency for a parity error, which may be specified by a user, multiplied by the clock period of the memory. Because the combination logic circuit 224 includes all of the combination logic required to perform the parity error calculations, the calculation operation may take advantage of the complete predetermined time. Thus, embodiments of the present invention may avoid the need to divide the combination logic between stages in a flip-flop chain, as is common in previous designs. Further, by removing the multiple flip-flop stages of previous designs, the FIFO stage 202 may avoid wasting time during flip-flop setup and transfer of data between the flip-flop stages. For example, in traditional flip-flop chains, there is an intrinsic delay in each flip-flop between the moment the clock signal transitions and the moment the input of the flip-flop becomes available on the output terminal of the flip-flop. This intrinsic delay is present in each flip-flop. Therefore, the resultant delay is multiplied by the number of flip-flops in the chain. Embodiments of the present invention avoid this delay by eliminating the need for the flip-flop chain.

Figure 3:
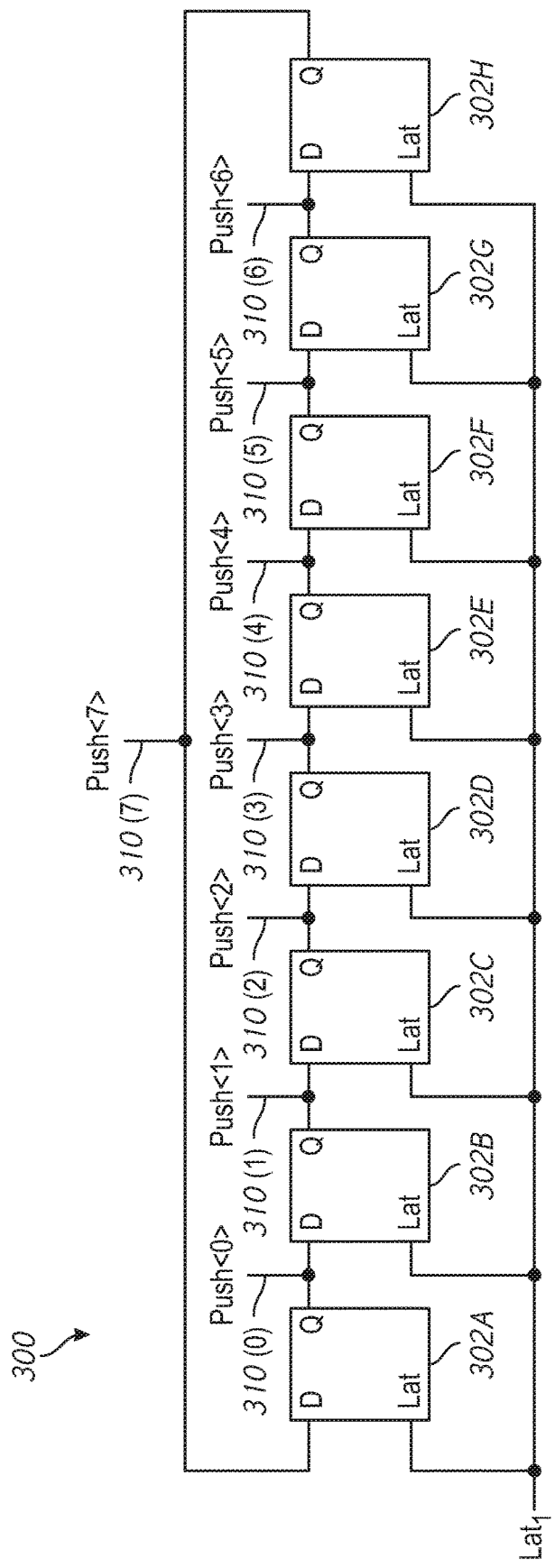
FIG. 3 is a schematic diagram of an example input ring counter circuit, in accordance with an embodiment of the present invention.

FIG. 3 is a schematic diagram of an example input ring counter circuit, generally designated 300, in accordance with an embodiment of the present invention. In various embodiments, the input ring counter circuit 300 may be implemented as the input ring counter circuit 110 in FIG. 1 and provide the push signals 310(0)-(7). Those skilled in the art will appreciate that the ring counter 300 provides only one example ring counter circuit, and that other configurations are possible without departing from the scope of this disclosure. For example, the input ring counter circuit may be an Overbeck ring counter or a Johnson ring counter. In other embodiments, the ring counter 300 may include pulse generators for generating pulsed push signals.

The input ring counter circuit 300 includes a number of flip-flops 302A-H, each having its data output terminal coupled to the data input terminal of the next flip flop 302 to form a ring counter. The input ring counter circuit 300 includes eight flip-flops 302A-302H to provide eight bits. Although the input ring counter circuit 300 includes eight flip-flops 302, any number of flip-flops 302 may be used. In various embodiments, the ring counter 300 may include one flip-flop 302 for each FIFO stage 102 in the FIFO stack circuit 100. Each flip-flop in the ring counter 300 is configured to receive an input latch signal, $Lat_1$. The input latch signal $Lat_1$ may be provided to the flip-flops 302 each time a new data input signal is provided on the common data input line 104 to be pushed into one of the FIFO stages 102 in FIG. 1. Initially, the data input of one of the flip-flops 302 may be an active signal (e.g., logical high), while the data input signals of the remaining flip-flops 302 may be inactive (e.g., logical low). For example, the data input of the flip-flop 302A may be active, while the data inputs of flip-flops 302B-H are inactive. Stated another way, the data output terminal of only one of the flip-flops 302 provides an active signal at any given point in time. With each input latch signal $Lat_1$, the active signal is transferred to the data input terminal of the next flip-flop 302 in the ring counter. For example, responsive to the first input latch signal $Lat_1$, the active signal may be provided by the output terminal of the flip-flop 302A to the input terminal of the flip, flop 302B, responsive to the second input latch signal $Lat_1$, the active signal may be provided by the output terminal of the flip-flop 302B to the input terminal of the flip, flop 302C, etc. The inactive signals provided by the other flip-flops 302 are also transferred to the next flip-flop 302, resulting in the output of one of the flip-flops 302 to have an active signal. In the embodiment of FIG. 3, on an eighth input latch signal $Lat_1$, the active signal completes a loop around the input ring counter circuit and returns to the data input terminal of the flip-flop 302A, while the data input terminals of the flip-flops 302B-H are inactive.

A plurality of push signals 310(0)-(7) may be provided by the input ring counter circuit 300. Each of the push signals 310(0)-(7) may be provided from a respective node between the data output terminal and the data input terminal of two adjacent flip-flops 302. For example, a first push signal 310(0) may be provided from a node between the data output terminal of the flip-flop 302A and the data input terminal of the flip-flop 302B, a second push signal 310(1) may be provided from a node between the data output terminal of the flip-flop 302B and the data input terminal of the flip-flop 302C, etc. Each of the push signals 310(0)-(7) may be provided to a separate FIFO stage (e.g., FIFO stages 102 (0)-(N)), as described above with respect to FIG. 1.

As previously described, FIG. 3 shows an example input ring counter circuit. A output ring counter circuit may be implemented in a similar fashion. For a output ring counter circuit, such as output ring counter circuit 112 of FIG. 1, each of the push signals 310(0)-(7) may be a pop signal (e.g., pop signals 112(0)-(7)). Additionally, the latch signal for the output ring counter circuit may be delayed by a predetermined period of time from the latch signal of the input ring counter circuit 300. For example, the latch signal of the output ring counter circuit may be delayed from the latch signal of the input ring counter circuit by a time period of the parity latency multiplied by a clock period of the memory. The timing of the push and pop signals is discussed in further detail below with respect to FIG. 4.

Figure 4:
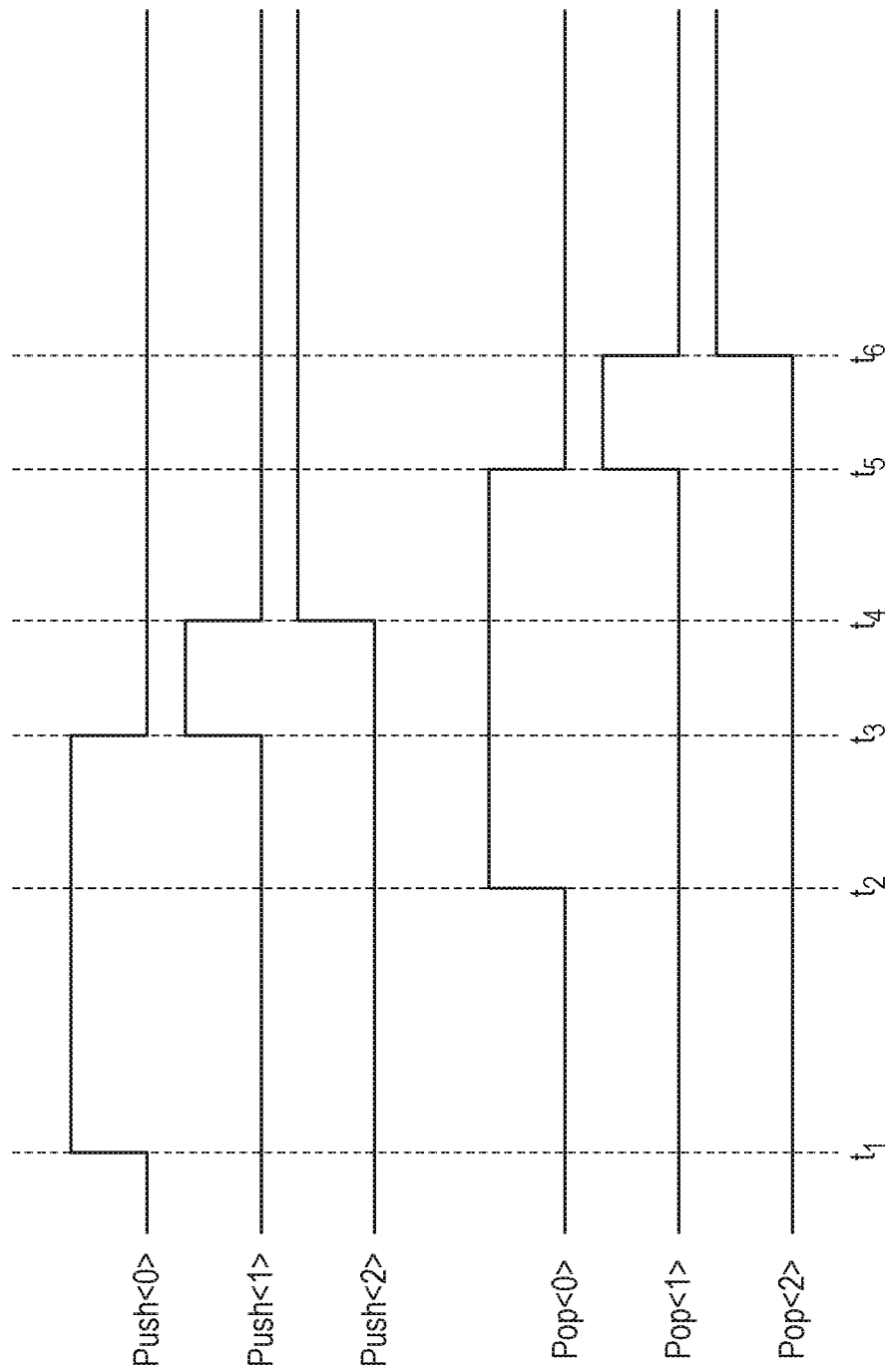
FIG. 4 is an example timing diagram of an input ring counter circuit and an output ring counter circuit, in accordance with an embodiment of the present invention.

FIG. 4 is an example timing diagram of push signals and pop signals provided by an input ring counter circuit and a output ring counter circuit, respectively, in accordance with an embodiment of the present invention. FIG. 4 shows timing diagrams for three push signals and three pop signals, however, additional push and pop signals may be implemented as needed. Each push signal shown in FIG. 4 has a corresponding pop signal. For example, the push signal Push<0> corresponds to the pop signal Pop<0>, the push signal Push<1> corresponds to the pop signal Pop<1>, and the push signal Push<2> corresponds to the pop signal Pop<2>. In various embodiments, a push signal may transition from inactive to active responsive to a new data input signal being received on a data input line, such as the common data input line 104 of FIG. 1. For example, at time $t_1$, the push signal Push<0> transitions to active. When the push signal Push<0> becomes active, the FIFO stage 102(0) may receive the input data on the common data input line 104 and perform combination logic operations on the data with a combination logic circuit, such as combination logic circuit 224, as described above with respect to FIGS. 1 and 2. After a predetermined period of time, the associated pop signal Pop<0> may transition from inactive to active at time $t_2$. As described above, in embodiments where the FIFO stages 102 are configured to perform parity calculations, the predetermined period of time may equal the parity latency multiplied by the clock period of the memory. Responsive to the pop signal Pop<0> becoming active, the FIFO stage 102(0) may provide the result of the combination logic operation to the common node 116 to provide the output signal 114. Each push signal may remain active until the next push signal is provided. For example, the push signal Push<0> remains active until the push signal <1> is activated. The pop signals may generally operate in the same manner.

In some embodiments, one or more sets of input data may be received in quick succession before any individual FIFO stage 102 can complete the combination logic operations on a single set of input data. Because the FIFO stages 102 are stacked and each receives its own push signal and pop signal, the FIFO stack circuit 100 may ensure that the pop signal of the previous FIFO stage occurs before the pop signal of a subsequent FIFO stage. That is, multiple FIFO stages may be simultaneously performing operations on different input data, but the output signal 114 is provided in the same order in which the input data was received. For example, at time $t_3$, push signal Push<1> transitions to active and the FIFO stage 102(1) receives the input data on the common data input line 104. Before the pop signal Pop<1> transitions to active, new input data may be provided on the common data input line 104. Responsive to the new input data, the push signal Push<2> may transition to active at $t_4$, and the FIFO stage 102(2) may receive the new input data. Between the time times $t_4$ and $t_5$, FIFO stages 102(1) and 102(2) may independently perform, in parallel, combination logic operations on their respective input data with respective combination logic circuits. At time $t_5$, the pop signal Pop<1> transitions to active and the FIFO stage 102(1) provides the result of the combination logic calculation to the common node 116 to provide the output signal 114. At time $t_6$, the pop signal Pop<2> transitions to active and the FIFO stage 102(2) provides the result of the combination logic calculation to the common node 116 to provide the output signal 114. Because the time period between a push signal and a corresponding pop signal is constant, the time between times $t_3$ and $t_4$ and times $t_5$ and $t_6$ is the same. Therefore, the pop signal Pop<1> is guaranteed to occur before the pop signal Pop<2>, ensuring that the output data from each FIFO stage 102 are provided to the common node 116 in the same order in which the input data were received.

Although only three push signals and three pop signals are shown in FIG. 4, those skilled in the art will appreciate that any number of push and pop signals may be used. For example, in the embodiment of FIG. 3, eight push signals may be provided with eight corresponding pop signals.

Figure 5:
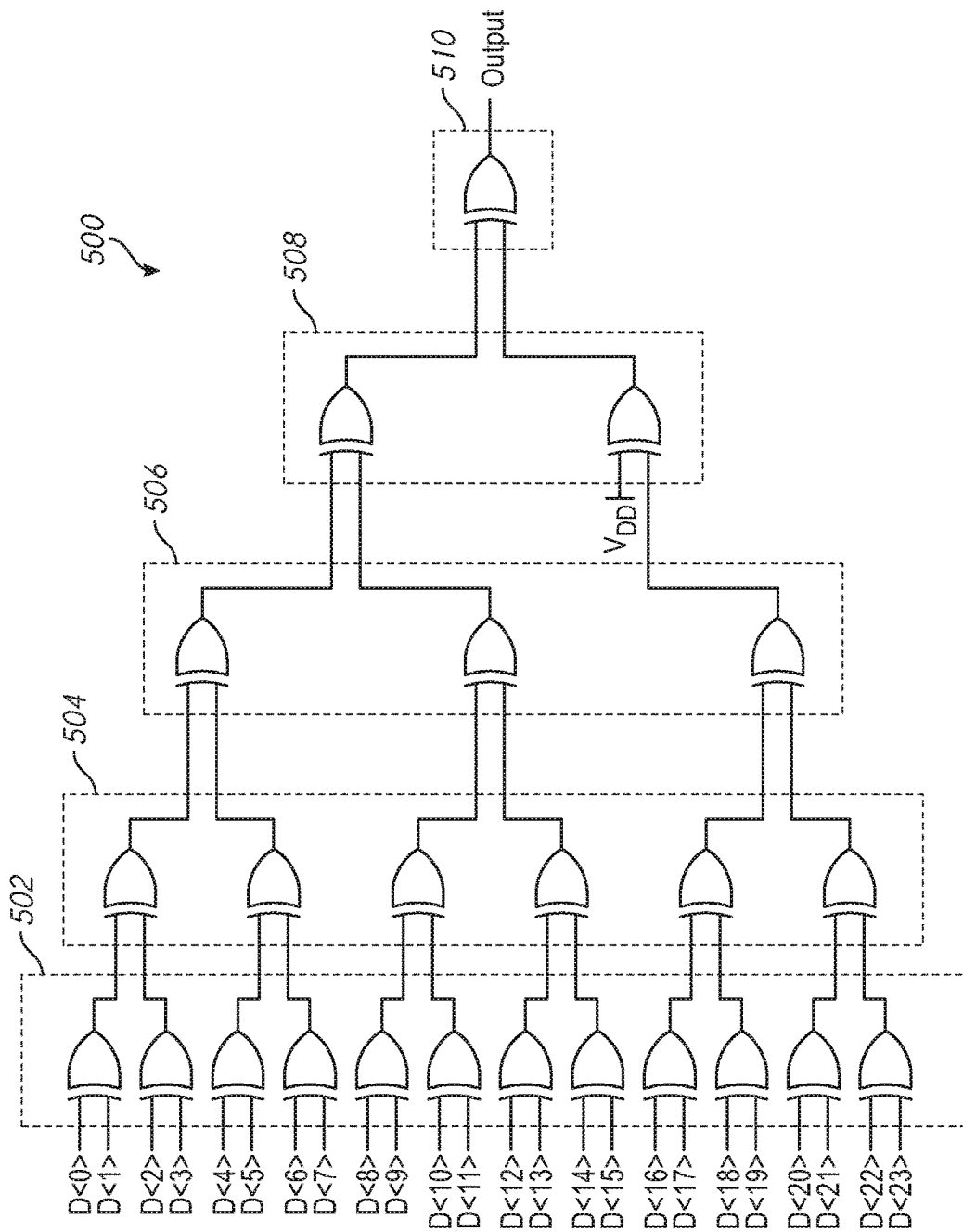
FIG. 5 is an example parity error calculator circuit, in accordance with an embodiment of the present invention.

FIG. 5 is an example parity error calculator, generally designated 500, in accordance with an embodiment of the present invention. The parity error calculator 500 may operate on parity error data provided with a command to a memory. Based on the result of the parity error calculation, the memory may determine whether there is a parity error in the command and may block the command from being performed by the memory if an error is detected. Alternatively, the memory may automatically correct the detected error and perform memory operations based on the corrected command. In various embodiments, the parity error calculator 500 may be implemented as the combination logic circuit 224 in FIG. 2. As shown in FIG. 5, the parity error calculator 500 may include a five stage XOR tree. The parity error calculator 500 may receive input data including 24 bit parity data (e.g., D<0>-D<23>). In various embodiments, the 24 bit parity data may be received from data output terminal of the latch 222 of FIG. 2 responsive to the push signal 210(0) transitioning to an active state. The first stage 502 may include 12 XOR gates, each receiving two bits of the 24 bit parity data. The second stage 504 may include 6 XOR gates, each receiving the outputs of two of the XOR gates of the first stage 502. The third stage 506 may include three XOR gates, each receiving the outputs of two of the XOR gates of the second stage 504. The fourth stage 508 may include two XOR gates. A first XOR gate of the fourth stage 508 may receive the outputs of two of the XOR gates of the third stage 506. A second XOR gate of the fourth stage 508 may receive the output of the third XOR gate of the third stage 506 and a first voltage supply VDD. The fifth stage 510 may receive the outputs of the two XOR gates of the fourth stage 508. The fifth stage 510 may provide an output signal to the data input terminal of the output circuit 226, and may be provided to the common node 116 responsive to the pop signal 212(0).

The parity error calculator may be configured to determine whether a parity error is present in a command/address packet. The command/address packet may be associated with one or more parity bits that were generated at the time the command was sent. The parity bits may be generated using a similar circuit to that shown in FIG. 3. When the command is received at the memory device, the parity error calculator 500 may operate on the command and compare the result to the parity bits sent with the command to determine if an error is present in the command. In operation, the parity error calculator 500 may compare pairs of bits in the command using XOR gates. Each successive stage of the parity error calculator may compare the outputs of the previous stage until a final output is provide from the fifth stage 510. The final output may them be compared to the parity bits that were generated prior to sending the command. If the final output matches the received parity bits, then the command does not contain errors. If the final output does not match the received parity bits, then an error may be present in the command, which may be corrected prior to performing the command.

Figure 6:
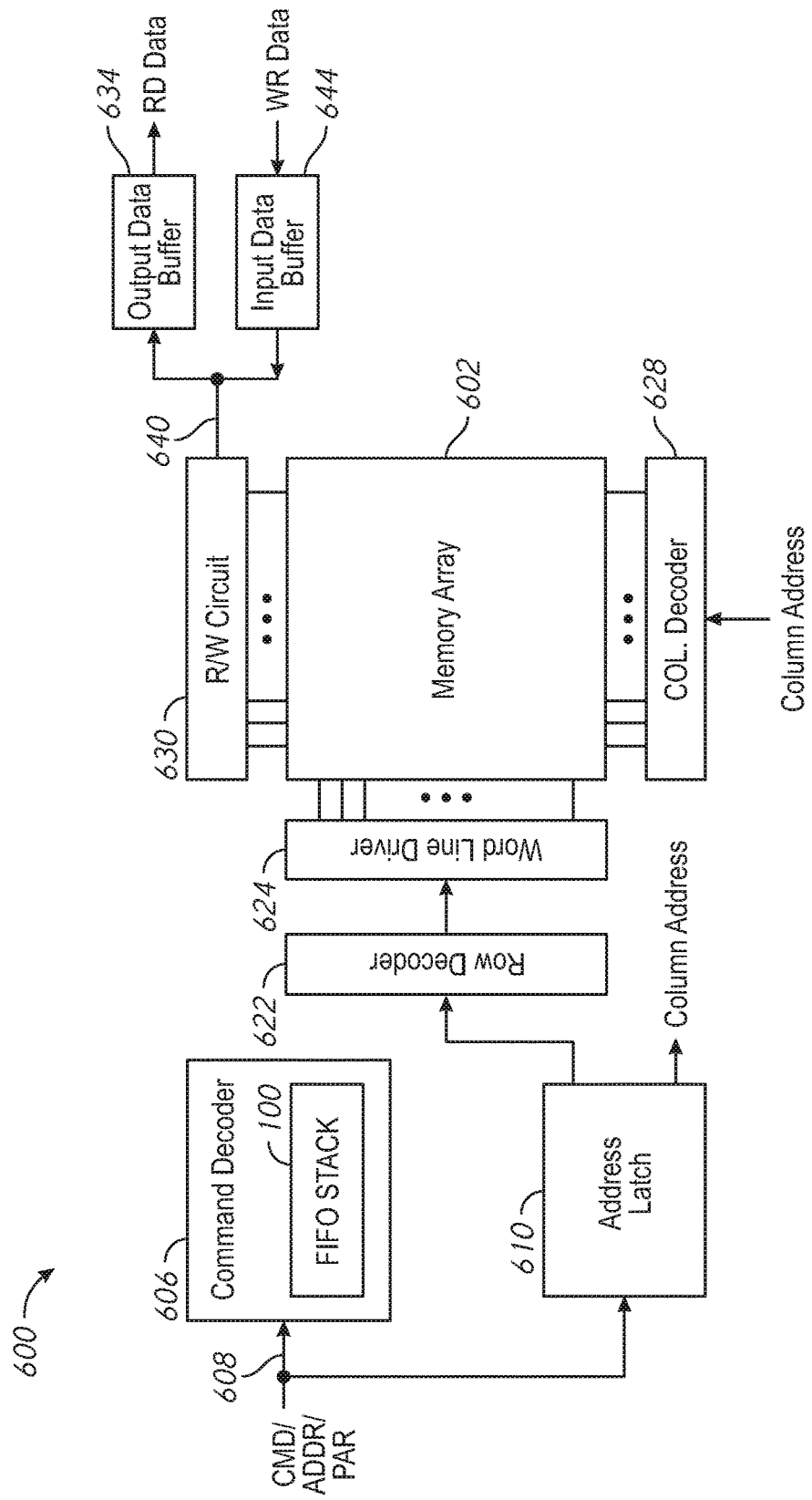
FIG. 6 is a block diagram of a memory including a FIFO stack circuit, in accordance with an embodiment of the present invention.

FIG. 6 is a block diagram of a memory 600 including a FIFO stack circuit 100, in accordance with an embodiment of the invention. The memory 600 may include an array 602 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 600 includes a command decoder 606 that may receive memory commands, address information, and parity data through a command/address/parity bus 608 and provide (e.g., generate) corresponding control signals within the memory 600 to carry out various memory operations. For example, the command decoder 606 may respond to memory commands provided to the command/address/parity bus 608 to perform various operations on the memory array 602. In particular, the command decoder 606 may be used to provide internal control signals to read data from and write data to the memory array 602. Row and column address signals may be provided (e.g., applied) to an address latch 610 in the memory 600 through the command/address/parity bus 608. The address latch 610 may then provide (e.g., output) a separate column address and a separate row address.

The command decoder 606 may further include the FIFO stack circuit 100 for performing combination logic operations, such as parity error calculations. The FIFO stack circuit 100 may receive parity data via the command/address/parity bus 608, which may be implemented as the common data input line 204. A FIFO stage (e.g., FIFO stage 102(0)) of the FIFO stack circuit 100 may perform a parity error calculation using an combination logic circuit, and provide the results of the parity error calculation. Based on the results of the parity error calculation, the command decoder 606 may block the command from being performed by the memory 600 if it is determined that the command includes a parity error. Alternatively, the command decoder 606 may correct the error in the command and provide the control signals based on the corrected command.

The address latch 610 may provide row and column addresses to a row address decoder 622 and a column address decoder 628, respectively. The column address decoder 628 may select bit lines extending through the array 602 corresponding to respective column addresses. The row address decoder 622 may be connected to a word line driver 624 that activates respective rows of memory cells in the array 602 corresponding to received row addresses. The selected data line (e.g., a bit line or bit lines) corresponding to a received column address may be coupled to a read/write circuitry 630 to provide read data to an output data buffer 634 via an input-output data path 640. Write data may be provided to the memory array 602 through an input data buffer 644 and the memory array read/write circuitry 630.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. A method comprising:
   receiving an input latch signal at an input ring counter circuit;
   activating a push signal at a first-in-first-out stage circuit, in response to receiving the input latch signal;
   receiving an output latch signal at an output ring counter; and
   activating a pop signal at the first-in-first-out stage circuit at a defined time after the push signal is activated at the first-in-first-out stage, the defined time is based, at least in part, on latency associated with combination logic operations performed within the first-in-first-out stage circuit.

2. The method of claim 1, wherein the pop signal is provided to the at least one first-in-first-out stage circuit, in response to receiving the output latch signal.

3. The method of claim 2, wherein the pop signal is temporally offset from the push signal by the defined time.

4. The method of claim 1, further comprising performing calculations on input data to generate output data responsive to the push signal, wherein the output data is generated based on the calculations responsive to the pop signal.

5. The method of claim 4, wherein activating the push signal at the at least one first-in-first-out stage circuit comprises:
   receiving the push signal and a select signal at a NAND gate, and providing a latch signal based, at least in part, on the push signal and the select signal; and
   providing the input data to a combination logic circuit based, at least in part, on the latch signal.

6. The method of claim 5, further comprising receiving the output data from the combination logic circuit and providing the output data based, at least in part, on the pop signal.

7. The method of claim 5, further comprising selectively enabling an output inverter to provide the output data based, at least in part, on the pop signal and the select signal.

8. The method of claim 4, further comprising determining whether the input data includes a parity error.

9. A method comprising:
   selectively providing, via an input ring counter circuit, a push signal to a first-in-first-out stage circuit;
   selectively providing a pop signal, via an output ring counter, to the first-in-first-out stage circuit; and
   activating the pop signal at the first-in-first-out stage circuit at a defined time after the push signal is activated at the first-in-first-out stage circuit, the defined time is based, at least in part, on latency associated with combination logic operations performed within the first-in-first-out stage circuit.

10. The method of claim 9, further comprising performing calculations on input data to generate output data responsive to receiving the push signal.

11. The method of claim 10, wherein performing calculations on the input data includes providing the output data based on the calculations responsive to receiving the pop signal.

12. The method of claim 10, further comprising receiving, via a NAND gate, the push signal and a select signal, and to providing a latch signal based, at least in part, on the push signal and the select signal.

13. The method of claim 12, further comprising providing the input data via a latch based, at least in part, on the latch signal.

14. The method of claim 10, further comprising receiving, via an output inverter, the output data and providing the output data based, at least in part, on the pop signal.

15. The method of claim 14, further comprising receiving, via a NAND gate, the pop signal and a select signal, and selectively enabling the output inverter to provide the output data based, at least in part, on the pop signal and the select signal.

16. The method of claim 10, further comprising determining, via a plurality of XOR gates, whether the input data includes a parity error.

17. The method of claim 10, further comprising determining, via a five-stage XOR tree, whether the input data includes a parity error.

18. The method of claim 9, wherein activating the pop signal includes temporally offsetting the push signal and the pop signal by the defined time.

19. An apparatus comprising:
   an input ring counter circuit configured to selectively provide a push signal to a first-in-first-out stage circuit; and
   an output ring counter to selectively provide a pop signal to the first-in-first-out stage circuit,
   wherein the pop signal is activated at the first-in-first-out stage circuit at a defined time after the push signal is activated at the first-in-first-out stage circuit, the defined time is based, at least in part, on latency associated with combination logic operations performed within the first-in-first-out stage circuit.

20. The apparatus of claim 19, wherein the first-in-first-out stage comprises a combination logic circuit to perform a parity error calculation.

* * * * *